United States Patent

Almgren

[19]

[11] Patent Number: 5,976,309
[45] Date of Patent: Nov. 2, 1999

[54] ELECTRODE ASSEMBLY FOR PLASMA REACTOR

[75] Inventor: Carl W. Almgren, Fort Collins, Colo.

[73] Assignee: LSI Logic Corporation, Milpitas, Calif.

[21] Appl. No.: 08/767,698

[22] Filed: Dec. 17, 1996

[51] Int. Cl.[6] .................................................. H05H 1/00
[52] U.S. Cl. ................ 156/345; 118/723 E; 118/723 R; 118/72 R
[58] Field of Search ........................ 156/345; 118/723 E, 118/723 R, 728

[56] References Cited

U.S. PATENT DOCUMENTS

| | | | |
|---|---|---|---|
| 4,367,114 | 1/1983 | Steinberg et al. | 156/345 |
| 4,485,000 | 11/1984 | Kawaguchi et al. | 204/298 |
| 4,585,920 | 4/1986 | Hoog et al. | 219/121 |
| 4,793,975 | 12/1988 | Drage | 422/186.05 |
| 4,971,676 | 11/1990 | Doue et al. | 204/297 R |
| 5,262,029 | 11/1993 | Erskine et al. | 204/298.15 |
| 5,271,788 | 12/1993 | Hasegawa et al. | 156/345 |
| 5,292,399 | 3/1994 | Lee et al. | 156/643 |
| 5,304,278 | 4/1994 | Bartha et al. | 156/345 |
| 5,443,689 | 8/1995 | Kimura et al. | 216/63 |
| 5,460,703 | 10/1995 | Nulman et al. | 204/192.12 |
| 5,494,523 | 2/1996 | Steger et al. | 118/723 E |
| 5,688,358 | 11/1997 | Tanaka et al. | 156/345 |

FOREIGN PATENT DOCUMENTS

| | | |
|---|---|---|
| 62-250639 | 10/1987 | Japan . |
| 5-234951 | 9/1993 | Japan . |

*Primary Examiner*—Thi Dang

[57] ABSTRACT

An electrode assembly for a plasma reactor used in connection with fabrication or manufacture of semiconductor devices. The electrode assembly includes an anode having, a top side that includes a pedestal adapted to support a wafer and defines an annular void that preferably surrounds the pedestal and extends to an outer periphery of the top side. The electrode assembly also includes a ring removably received within the annular void so that the ring extends from the pedestal and covers substantially the entire portion of the top side of the anode save the pedestal. The thickness of the ring is slightly less than the height of the pedestal so that the top surface of the ring is located below the top surface of the pedestal. When the wafer is supported by the pedestal during fabrication of a semiconductor device, the wafer extends beyond the circumference of the pedestal, and a gap is defined between the wafer and the removable ring. The removable ring can be quickly and easily removed and replaced.

1 Claim, 2 Drawing Sheets

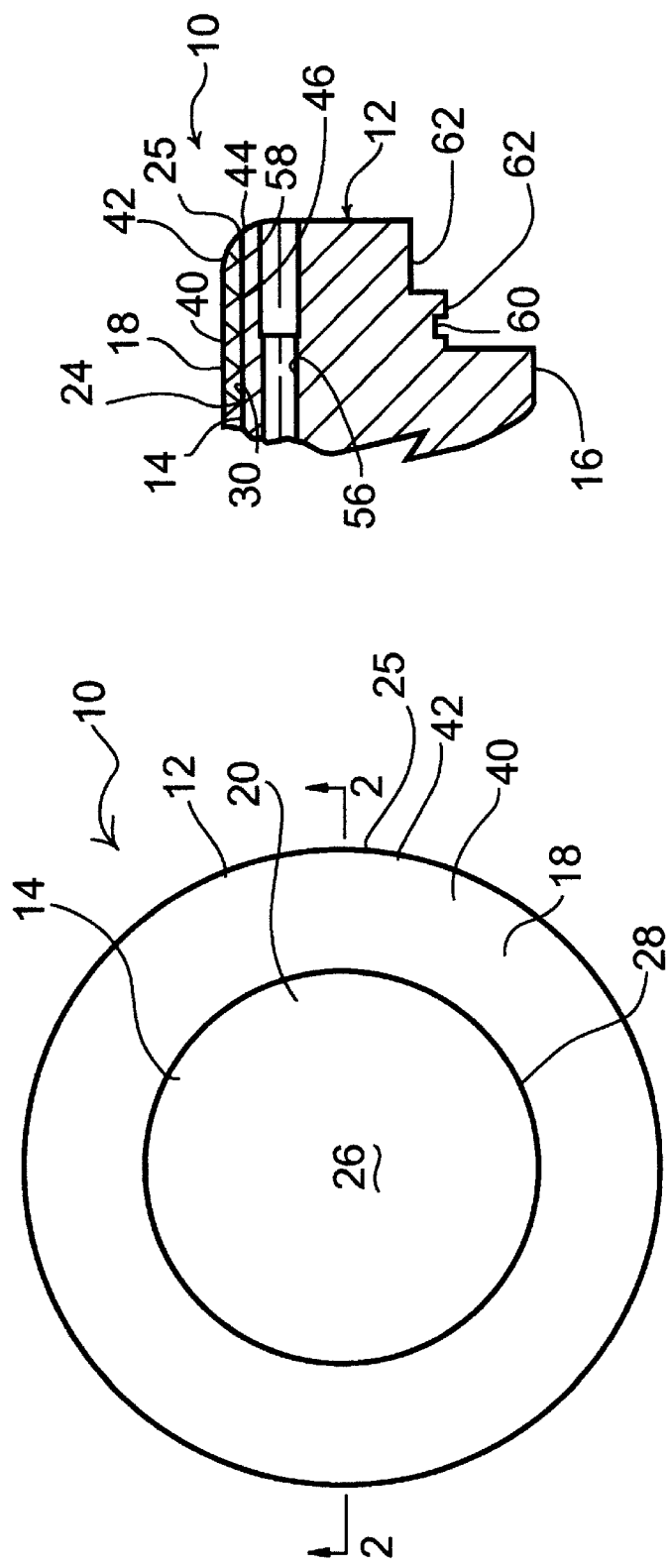
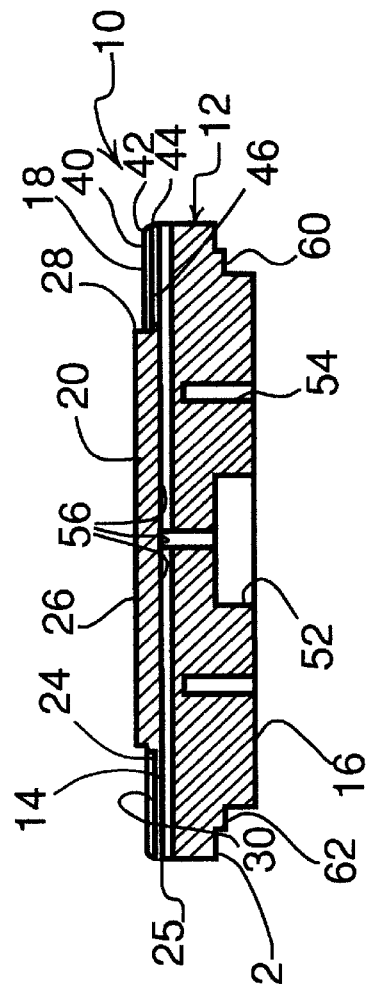
FIGURE 1
FIGURE 2
FIGURE 3

ELECTRODE ASSEMBLY FOR PLASMA REACTOR

The present invention relates to an electrode assembly for a plasma reactor assembly for use in fabrication or manufacture of semiconductors.

BACKGROUND

Fabrication or manufacture of semiconductor devices typically is accomplished through the use of a silicon wafer or the like which is treated within a plasma reactor assembly. Layers of different elements or components are formed on the wafer by, for example, depositing the element or compound onto the wafer and then etching the element to provide the desired layout.

The plasma reactor assembly may be used for depositing the desired material onto the wafer or for etching the material from the wafer. The plasma reactor assembly may include a chamber and upper and lower electrodes. The wafer typically rests on and is in electrical contact with the lower electrode.

After repeated use of the plasma reactor assembly, however, the lower electrode must be replaced because the top surface of the lower electrode becomes degraded. Replacement of the lower electrode can be a time intensive process which not only requires man hours but also results in unwanted downtime of the plasma reactor assembly.

Accordingly, it is an object of the present invention to provide an electrode assembly for a plasma reactor assembly for use in connection with fabricating semiconductors that substantially reduces degradation of the surface of the electrode, and, thus, substantially reduces the need to replace the electrode.

It is a further object of the present invention to provide such an electrode assembly that includes a removable ring for covering a relatively large surface area of the electrode.

It is further object of the present invention to provide such an electrode assembly wherein the removable ring has a substantially flat and unobstructed top surface to facilitate placement of the wafer onto the electrode.

It is a further object of the present invention to provide such an electrode assembly that is adapted to reduce coupling between the plasma and a top surface of the electrode.

It is a still further object of the present invention to provide such an electrode assembly wherein the removable ring can be easily and quickly removed and replaced.

SUMMARY

In accordance with these and other objects, an electrode assembly is provided for a plasma reactor assembly used in connection with fabrication or manufacture of semiconductor devices. In a preferred embodiment, the electrode assembly includes an electrode having a top or first side that includes a pedestal adapted to support a wafer and that defines an annular void that preferably surrounds the pedestal and extends to a periphery of the top side.

The electrode assembly also includes a ring removably received within the annular void so that the removable ring surrounds the pedestal and extends to the periphery of the top side of the electrode and covers substantially the entire portion of the top side save the pedestal. The removable ring includes a top surface that is substantially flat and substantially unobstructed, and may also include a chamfered portion around the outer periphery of the removable ring. The thickness of the removable ring preferably is slightly less than the height of the pedestal so that the top surface of the removable ring is located below or proximal a top surface of the pedestal. As a result, when the wafer is supported on the pedestal during fabrication of a semiconductor device, the wafer may extend freely beyond the periphery or circumference of the pedestal, and a gap is defined between the wafer and the removable ring.

The electrode assembly in accordance with a preferred embodiment of the invention provides several advantages. For example, coupling between the plasma and the surfaces of the electrode is substantially reduced since the removable ring covers substantially the entire top side of the electrode save the pedestal and since the wafer covers the top surface of the pedestal and extends beyond the circumference of the pedestal. As a result, degradation of the top side of the electrode is substantially reduced.

Further, the removable ring lies below the wafer, and, thus, the etching effects of the removable ring are substantially reduced since the removable ring is further spaced from the opposing electrode.

Additionally, the removable ring provides an increased tolerant placement of the wafer onto the electrode because the top surface of the removable ring extends substantially unobstructed to the periphery of the top side of the electrode. Further, the removable ring, which becomes degraded after numerous uses, can be quickly and easily removed and replaced manually or the like because it extends to the periphery of the electrode.

BRIEF DESCRIPTION OF DRAWINGS

The present invention and the advantages thereof will become more apparent upon. consideration of the following detailed description when taken in conjunction with the accompanying drawings:

FIG. 1 is a top view of an electrode assembly for a plasma reactor assembly in accordance with a preferred embodiment of the invention;

FIG. 2 is a cross sectional view taken along lines 2—2 of FIG. 1;

FIG. 3 is an enlarged partial view of one end of FIG. 2;

DETAILED DESCRIPTION OF THE PREFERRED EMBODIMENTS

Figure 5:
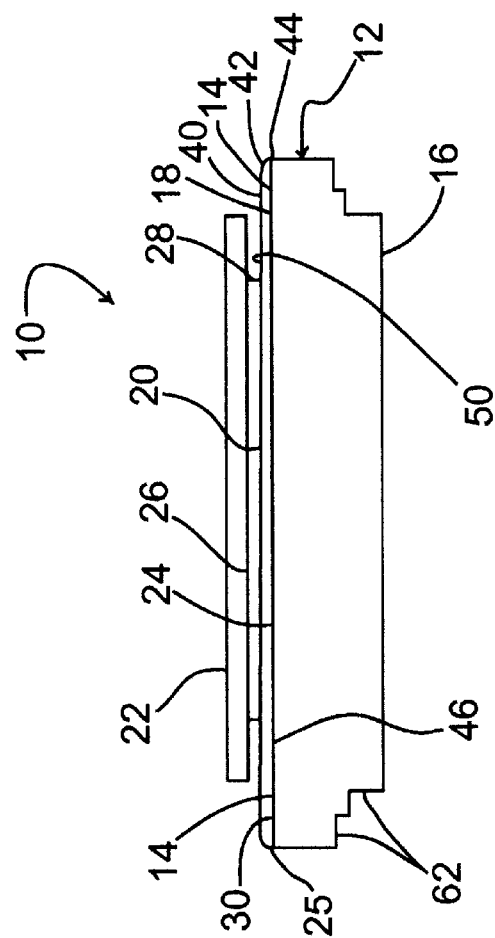
FIG. 5 is a side plan view of the electrode assembly of FIGS. 1–4, illustrating a wafer supported by the pedestal of the electrode.
Figure 4:
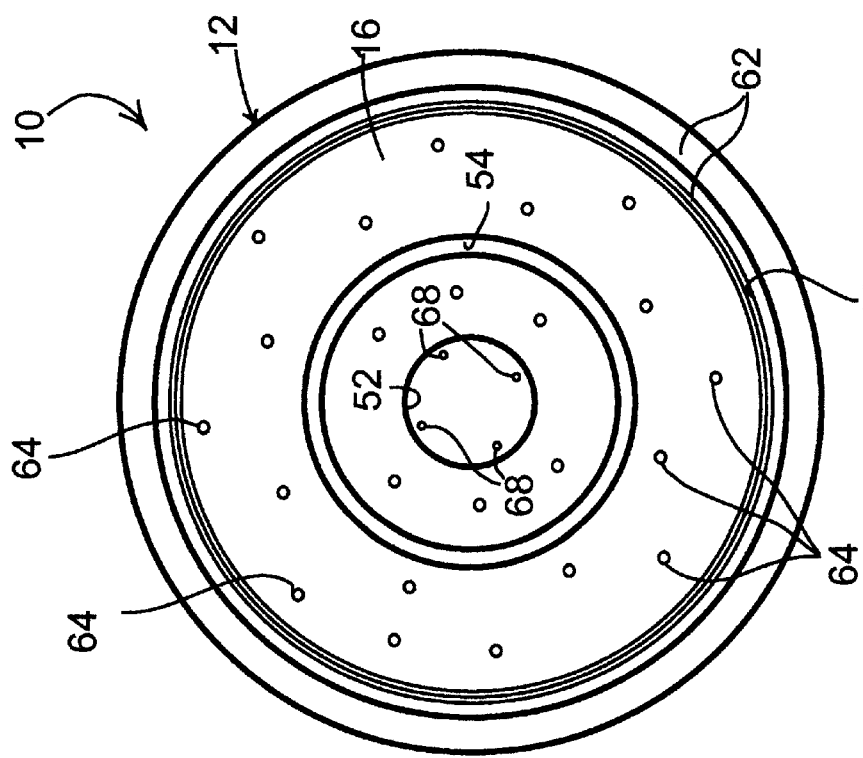
FIG. 4 is a bottom view of the electrode assembly of FIGS. 1–3.

FIGS. 1–5 illustrate an electrode assembly 10 in accordance with a preferred embodiment of the invention comprising an electrode desirably in the form of an anode 12 having a top or first side 14, a bottom or second side 16, and a ring 18 removably engaged with the first side 14 of the anode.

The first side 14 of the anode 12 includes a pedestal 20 for supporting a wafer 22 during fabrication of a semiconductor device (see, e.g., FIG. 5), and a portion 24 that surrounds the pedestal 20 and preferably extends to a periphery 25 of the first side, The pedestal 20 preferably includes a circular top pedestal surface 26 and an annular pedestal wall 28.

The first side 14 of the anode 12 defines a void 30 that surrounds the pedestal 20 and preferably extends to the periphery 25 of the first side 14. The void 30 is adapted to receive the ring 18 such that the ring surrounds the pedestal 20, extends to the periphery 25, and covers substantially the entire portion 24 of the first side 14 of the anode 12. The ring 18 is adapted to prevent or reduce surface degradation of the first side 14 of the anode 12 by eliminating or reducing coupling of the plasma and the first side of the anode.

Desirably, the void 30 is annular and has a generally C-shaped cross section. The void 30 is defined by the pedestal wall 28 and by the portion 24 of the first side 14 of the anode 12 that surrounds the pedestal wall. The ring 18 preferably abuts the pedestal wall 28 substantially around the pedestal 20. The ring 18 includes a top ring surface 40 that is substantially flat and substantially unobstructed to avoid any interference with placement of the wafer 22. Since the ring 18 extends to the periphery 25 of the first side 14 of the anode 12, the ring can be quickly and easily removed from the anode and replaced by, for example, manually separating a portion of the outer ring periphery 42 of the ring 18 from the anode and then removing the entire ring. A new ring 18 can then be replaced on the anode 12.

In a preferred embodiment of the invention, the outer ring periphery 42 is chamfered to avoid sharp edges and the associated high field points that tend to be caused by sharp edges. A portion of the wall 44 of the anode 12 adjacent the outer ring periphery 42 may also be chamfered to complement the chamfered outer ring periphery. The bottom side 46 of the ring 18 and the portion 24 of the first side 14 of the anode that surrounds the pedestal 20 desirably are both flat to complement each other, so that the bottom side 46 of the ring and the portion 24 are in face-to-face contact (see, e.g., FIGS. 2 and 3).

The thickness of the ring 18 desirably is slightly less than the height of the pedestal 20 so that the top ring surface 40 is located below or proximal of the top pedestal surface 26. In a preferred embodiment, for example, the top ring surface 40 is located in the range of about 0.01 mm to 0.5 mm below the top pedestal surface 26. A more preferred range is about 0.1 mm to about 0.2 mm, where a preferred dimension is 0.12 mm.

In accordance with a preferred embodiment of the invention, when the wafer 22 is supported by the pedestal 20 during fabrication of a semiconductor device, the wafer extends freely beyond the circumference of the pedestal and above the removable ring 18, and a gap 50 is defined between the wafer and the top ring surface 40 (see, e.g., FIG. 5). The gap 50 results in reduced etching effects on the ring 18 since the ring is further spaced from the plasma source.

The anode 12 and ring 18 may be constructed of any suitable material, such as, for example, an anodized aluminum. If desired, the top ring surface 40 and the top pedestal surface 26 (and any other surfaces of the electrode assembly 10 exposed to the plasma) may be coated with a protective material, such as, for example, an anodized aluminum coating. Other protective materials are ceramic and PTFE. The anodized material protects the ring 18 from the plasma etching process and also reduces radio frequency coupling between the plasma source and the surfaces of the anode 12.

The electrode assembly 10 in accordance with a preferred embodiment of the invention provides several advantages. For example, coupling between the plasma and surfaces of the anode 12 is eliminated or substantially reduced since the ring 18 covers substantially the entire first side 14 of the anode 12 save the pedestal 20 and since the wafer 22 covers the top pedestal surface 26 and extends beyond the circumference of the pedestal. As a result, degradation of the surfaces of the anode 12 is substantially reduced. Moreover, since the ring 18 lies below the pedestal 20 and gap 50 is defined between the wafer 22 and the ring, the etching effects on the ring 18 are reduced.

Additionally, the ring 18 increases the placement tolerance of the wafer 22 on the anode 12 because the top ring surface 40 extends substantially unobstructed to the periphery 25 of the first side 14 of the anode and because the wafer extends freely beyond the circumference of the pedestal 20. Moreover, the ring 18, which will become degraded after numerous uses, can be quickly and easily removed and replaced manually or the like because it extends to the periphery 25 of the first side 14 of the anode 12.

The illustrated electrode assembly 10 in accordance with a preferred embodiment of the invention desirably may be used in connection with frontside etching on the wafer and as the anode of a LAM RESEARCH 490 or a LAM RESEARCH 590 plasma reactor assembly manufactured by Lam Research of Freemont, Calif. The illustrated electrode assembly 10, for example, is adapted to engage a wafer lifter of the LAM RESEARCH 490 (or 590) assembly within a bore 52 defined in the second side 16 of the anode 12. In the illustrated embodiment, an annular channel 54 is also defined in the second side 16, which is in fluid communication with a fluid supply of the LAM RESEARCH 490 (or 590) assembly to facilitate cooling of the electrode assembly 10.

In a preferred embodiment of the invention, a plurality of radial passageways 56 may be defined within the anode 12 to further facilitate cooling of the electrode assembly 10 and the release of gases or other fluids. If desired, for example, four radial passageways 56 may be included extending approximately 90 degrees apart. If desired, the radial passageways 56 may include enlarged portions 58 adapted to receive teflon plugs or the like. An annular bore 60 many also be defined in the anode 12 for receiving a sealing ring (see, e.g., FIGS. 3 and 4).

The anode 12 may be mounted to the plasma reactor assembly in any suitable manner. In the illustrated embodiment, for example, a pair of annular, concentric recesses 62 are defined adjacent the second side 16 of the anode 12 for engagement with a bottom of a chamber assembly of the plasma reactor of the LAM RESEARCH 490 (or 590) assembly. A plurality of bolt holes 64 and lifter pin holes 68 and the like may be defined in the anode 12 to complement the LAM RESEARCH 490 (or 590) assembly or other plasma reactor assembly.

The foregoing description is for purposes of illustration only and is not intended to limit the scope of protection accorded this invention. The scope of protection is to be measured by the following claims, which should be interpreted as broadly as the inventive contribution permits.

The claimed invention is:

1. An electrode assembly for a plasma reactor assembly used in connection with fabrication of a semiconductor, the electrode assembly comprising:

an electrode having an annular first side that includes a pedestal adapted to support a wafer, said pedestal having a top surface and an annular void surrounding said pedestal; and a ring removably received within said annular void so that said ring surrounds said pedestal and extends to an outer periphery of the first side, said annular first side of said electrode and the ring having substantially the same outer diameter and said ring having a top surface that is coated with anodized aluminum.

* * * * *